(12) United States Patent
Heilmann et al.

(10) Patent No.: US 6,245,922 B1
(45) Date of Patent: *Jun. 12, 2001

(54) CHROMOPHORIC PHOTOCROSSLINKING COMPOUND

(75) Inventors: Steven M. Heilmann, Afton; Gaddam N. Babu, Woodbury; Larry R. Krepski, White Bear Lake; Howell K. Smith, II, Grant Township; Daniel E. Mickus, Mahtomedi, all of MN (US)

(73) Assignee: 3M Innovative Properties Company, Saint Paul, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/751,466

(22) PCT Filed: Jul. 26, 1996

(86) PCT No.: PCT/US96/12355

§ 371 Date: Nov. 19, 1996

§ 102(e) Date: Nov. 19, 1996

(87) PCT Pub. No.: WO97/05101

PCT Pub. Date: Feb. 13, 1997

Related U.S. Application Data

(63) Continuation-in-part of application No. 08/505,349, filed as application No. PCT/US96/09600 on Jul. 28, 1995, now abandoned, which is a continuation-in-part of application No. 08/282,058, filed on Jul. 29, 1994, now abandoned.

(51) Int. Cl.⁷ .......................... C07C 50/18; C07C 45/00; C07C 317/08
(52) U.S. Cl. ...................... 552/208; 560/41; 560/42; 560/122; 560/123; 560/124; 560/125; 560/170; 560/150; 564/153
(58) Field of Search ................ 560/170, 41, 42, 560/150, 122, 123, 125, 124; 564/153; 552/208

(56) References Cited

U.S. PATENT DOCUMENTS

| Re. 24,906 | 12/1960 | Ulrich | 206/59 |
|---|---|---|---|
| Re. 34,652 | 6/1994 | Heilmann et al. | 560/150 |
| 4,181,752 | 1/1980 | Martens et al. | 427/54.1 |
| 4,181,755 | 1/1980 | Liu et al. | 430/314 |
| 4,243,500 | 1/1981 | Glennon | 204/159.12 |
| 4,303,485 | 12/1981 | Levens | 204/159.24 |
| 4,304,705 | 12/1981 | Heilmann et al. | 260/30.4 |
| 4,329,384 | 5/1982 | Vesley et al. | 428/40 |
| 4,330,590 | 5/1982 | Vesley | 428/336 |
| 4,364,972 | 12/1982 | Moon | 427/54.1 |
| 4,379,201 | 4/1983 | Heilmann et al. | 428/345 |
| 4,391,687 | 7/1983 | Vesley | 204/159.16 |
| 4,459,416 | 7/1984 | Curtis et al. | 549/27 |
| 4,737,559 | 4/1988 | Kellen et al. | 526/291 |
| 4,777,276 | 10/1988 | Rasmussen | 556/419 |
| 4,874,822 | 10/1989 | Rasmussen et al. | 525/279 |
| 4,922,004 | 5/1990 | Kohler et al. | 560/221 |
| 5,180,756 | 1/1993 | Rehmer et al. | 522/35 |
| 5,202,361 | 4/1993 | Zimmerman et al. | 522/120 |
| 5,223,645 | 6/1993 | Barwich et al. | 564/158 |
| 5,334,447 | 8/1994 | Kitamura et al. | 428/317.3 |

FOREIGN PATENT DOCUMENTS

| 43 03 183 C1 | 7/1994 | (DE) | C09J/7/00 |
|---|---|---|---|
| 0 486 897 A1 | 5/1992 | (EP) | C07C/235/20 |
| 58-046236 | 3/1983 | (JP) | F16D/27/10 |
| 2-248482 | 4/1990 | (JP) | C09J/4/02 |
| 6-166858 | 6/1994 | (JP) | C09J/133/06 |
| 6-172729 | 6/1994 | (JP) | C09J/133/06 |
| 6-200225 | 6/1994 | (JP) | C09J/133/08 |
| WO 95/10552 | 4/1995 | (WO) | C08F/20/58 |
| WO 96/05249 | 2/1996 | (WO) . | |

OTHER PUBLICATIONS

Girard et al., "Lanthanide Reagents in Organic Chemistry, A Convenient Catalytic Oxidation of Benzoins to Benzils Using Lanthanum Nitrates," *Tetrahedron Letters,* No. 50, pp. 4513–14, Pergamon Press (1975).

Hubner et al., *Agnew. Makromol. Chem.,* 11, 109 (1970).

Iwakura et al., *Tetrahedron,* 23, 3363 (1967).

Krepski et al., *Tetrahedron Letters,* vol. 24, No. 38, pp. 4075–78 (1983).

Kulkari et al., *J. Poly. Sci.,* 54, 491 (1961).

Taylor et al., *J. Poly. Sci. Poly. Let. Ed.,* 7, 597 (1969).

*Polymer Handbook,* 2nd Ed., edited by J. Brandrup and E.H. Immergut, Wiley–Interscience, New York, pp. II 47–9 (1975).

*Primary Examiner*—Shailendra Kumar
(74) *Attorney, Agent, or Firm*—David G. Burleson; Ann M. Mueting; Philip Y. Dahl

(57) ABSTRACT

A photoactive compound that is the reaction product of an alkenyl azlactone compound and a nucleophilic aromatic ketone is described. Mer units derived from this compound can be used, for example, to crosslink via a hydrogen abstracting mechanism acrylic polymers in which they are incorporated.

12 Claims, No Drawings

CHROMOPHORIC PHOTOCROSSLINKING COMPOUND

This application is a continuation-in-part Ser. No. 08/505,349, filed Aug. 23, 1995, now abandoned, which is the national stage entry, pursuant to 35 U.S.C. §371, of PCT International App. No. PCT/US96/09600, filed Jul. 28, 1995, which is a continuation-in-part U.S. Ser. No. 08/282,058, filed Jul. 29, 1994, now abandoned and also is a 371 of PCT/US96/12355, filed Jul. 26, 1996.

BACKGROUND OF THE INVENTION

1. Field of the Invention

This invention relates to photoactive crosslinking compounds prepared by reacting an electrophilic 2-alkenyl azlactone compound and a nucleophilic aromatic ketone. These photoactive compounds can be copolymerized with acrylic monomers and photoactivated by actinic radiation so as to crosslink such polymers.

2. Background Information

Pressure sensitive adhesives (PSAs) made by photopolymerizing an alkyl acrylate and a polar copolymerizable monomer are known in the art. See, e.g., U.S. Pat. Nos. RE 24,906, 4,181,755, 4,364,972, and 4,243,500. Acrylic-based PSAs exhibit good adherence to high energy (i.e., polar) substrates.

Solvent-processed acrylic PSA compositions can be crosslinked by adding a polyfunctional crosslinking agent that reacts with a reactive group present in the polymer. See, e.g., Japanese Kokoku 58[1983]-046236 in which is described a solvent-processed crosslinked acrylic PSA wherein incorporated isocyanate groups are available for reaction with the crosslinking agent.

Hot melt coating a PSA composition eliminates the necessity of solvent processing. To hot melt process an adhesive composition, the composition must be uncrosslinked during the coating process; however, to achieve a PSA with balanced properties (i.e., peel and shear adhesion), the composition eventually must be crosslinked. In hot melt coating processes, this is usually done by exposure to high energy radiation (e.g., E-beam or high intensity ultraviolet radiation). Commonly, when high intensity ultraviolet radiation is used, a photoactive crosslinking species such as benzophenone is added to the composition.

A more efficient method of photocrosslinking involves incorporating mer units including pendent hydrogen abstracting moieties into the polymer backbone prior to coating. Such polymers can be hot melt coated and subsequently cured by conventional irradiation techniques. This process is typified by U.S. Pat. No. 4,737,599 where a PSA with good adhesion to skin is described.

The cohesive strength of an acrylic PSA can be increased without unduly affecting its compliance by utilizing a photoactive crosslinking agent in conjunction with a photoinitiator. See, e.g., U.S. Pat. Nos. 4,181,752, 4,329,384, 4,330,590, 4,391,687, and 5,202,361. Useful photoactive crosslinking agents include various aldehydes, quinones, and particularly certain chromophore-substituted halomethyl-s-triazines (because they provide desirably shortened reaction times and somewhat greater tolerance to oxygen over the non-halomethyl-containing agents), although their use can result in evolution of HCl.

Copolymerizable photoinitiators such as 2-[4-(2-hydroxy-2,2-dimethyl-1-oxopropyl)phenoxy]ethyl 2-propenoate and their use in the polymerization of ethylenically unsaturated compounds is disclosed in U.S. Pat. No. 4,922,004.

Japanese Kokai 2[1990]-248482 describes a photocurable PSA obtained by reacting (a) 30 to 50 parts by weight (pbw) of a copolymer of an acrylic acid alkyl ester, a copolymerizable ethylenically unsaturated monomer having a polar group, and a copolymerizable monomer with a photosensitizing group (such as 2-acryloyloxybenzophenone or 1-acryloyloxy-2-[4-(4-chlorobenzoyl)benzoyloxy]ethane); (b) 40 to 60 pbw of an aryloxy acrylic monomer such as phenoxyethyl acrylate or nonylphenoxyethyl acrylate; and (c) a tackifying resin. The composition is cured using a total dose of energy of 300 to 800 mJ/cm$^2$ from a high pressure mercury lamp. Such high intensity ultraviolet radiation is likely to produce an adhesive that has a shear strength value less than 100 minutes.

Similarly, DE 43 03 183 C1 (Germany) discloses a method for producing PSA layers comprising the steps of thickening a monomer mixture that includes a photoinitiator with a separately made solvent-free saturated UV-reactive polyacrylate, coating the thickened mixture onto a substrate, and irradiating the coated substrate. The separately made polymer comprises side chains that, when irradiated, participate in crosslinking reactions. The sole example involves the addition of a commercially available polymer having a molecular weight of about 200,000 to a monomer mixture that is then polymerized.

The shear values of PSAs prepared by actinically irradiating acrylic monomers can be enhanced by the addition of polyacrylic crosslinking agents. See, e.g., U.S. Pat. No. 4,379,201. Such PSAs involve networks and are sensitive to processing conditions.

An ultraviolet (UV) radiation-curable composition that includes a copolymer of ethylenically unsaturated monomers, ethylenically unsaturated monomers, and optionally one or more polyethylenically unsaturated compounds is described in U.S. Pat. No. 5,180,756.

When attempting to photocrosslink acrylic PSA compositions, one of two broad categories of photoactive crosslinking agents is generally used: an α-cleaving agent or a hydrogen abstracting agent. Of the latter category, the most commonly used example is probably acryloylbenzophenone (ABP). This photocrosslinker is an efficient crosslinker, but it is not always soluble in the relatively non-polar monomers that make up PSA monomer formulations.

Acrylic derivatives of anthraquinone, benzophenone, xanthone, thioxanthone, and 9-fluorenone have been described previously, as has an acrylamide derivative of anthraquinone. However, none of these compounds has been described as being useful as a reactive crosslinker for PSA compositions.

What has not been previously described is an easily prepared, effective hydrogen abstracting-type photocrosslinking agent that exhibits enhanced solubility in relatively non-polar monomers.

SUMMARY OF THE INVENTION

Briefly, the present invention provides an easily synthesizable photoactive crosslinking compound that has the general formula

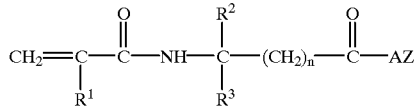

wherein
- $R^1$ is H or a $C_1$ to $C_3$ alkyl group, preferably H or a methyl group;
- $R^2$ and $R^3$ are independently H, an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or $R^2$ and $R^3$ taken together with the carbon to which they are attached form a carbocyclic ring containing 4 to 12 ring atoms;
- n is 0 or 1;
- A is $XCR^4R^5$, $[X(CH_2CHR^1)]_m$, or $X-[(CH_2CHR^1Y)]_m$ where X is O, S, NH, or $NR^4$; Y is O, C(O)O, OC(O)NH, OC(O)O, or NHC(O)O; $R^4$ and $R^5$ are independently H, a $C_1$ to $C_6$ alkyl group, or an aryl group; and m is 0 or 1; and
- Z is a moiety derived from an acetophenone, benzophenone, anthraquinone, 9-fluorenone, anthrone, xanthone, thioxanthone, acridone, dibenzosuberone, benzil, or chromone.

In another aspect, the present invention provides a method of making the above photoactive crosslinking compound comprising the steps of solubilizing and allowing to react a 2-alkenyl azlactone compound and a nucleophilic acetophenone, benzophenone, anthraquinone, 9-fluorenone, anthrone, xanthone, thioxanthone, acridone, dibenzosuberone, benzil, or chromone. This reaction can be facilitated by the addition of a catalyst comprising a nitrogen-containing base, preferably a bicyclic amidine or guanidine, or a trivalent phosphorous compound.

Unless otherwise indicated, the following definitions apply throughout this document:
- "group" or "compound" or "moiety" or "monomer" or "polymer" means, unless otherwise noted, a chemical species that can be substituted by conventional substituents that do not interfere with the desired product, e.g., alkyl, alkoxy, aryl, dialkylamino, halo, nitro, and cyano groups;
- "alkyl" means the monovalent residue remaining after removal of one hydrogen atom from a saturated linear or branched chain hydrocarbon having 1 to 14 carbon atoms;
- "aryl" means the monovalent residue remaining after removal of one hydrogen atom from an aromatic or heteroaromatic compound that can consist of one ring or two fused or catenated rings having 5 to 12 ring atoms which can include up to 3 heteroatoms selected from S, N, and nonperoxidic O, and in which the carbon atoms can be substituted by up to three halogen atoms, $C_1$ to $C_4$ alkyl groups, $C_1$ to $C_4$ alkoxy groups, N,N-di($C_1$ to $C_4$ alkyl)amino groups, nitro groups, cyano groups, and $C_1$–$C_4$ alkyl carboxylic ester groups; and "azlactone" means a compound having the general formula

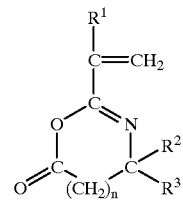

wherein n, $R^1$, $R^2$, and $R^3$ are defined as before.

The photoactive crosslinking compound of the present invention can be used to crosslink, for example, acrylic adhesive compositions in much the same way as ABP. However, the synthesis of the photoactive crosslinking compound of the present invention involves a simple addition reaction of an electrophilic azlactone and a nucleophilic aromatic ketone with no side products being created.

These addition products are acrylamidoacetyl- (or propionyl-) functional and, accordingly, are very reactive in free radical-initiated mono- and copolymerization reactions. Also, the addition products are more hydrolytically stable than their acrylate counterparts.

A significant advantage of using the 2-alkenyl azlactone instead of acryloyl chloride as an acylating agent is that the azlactone nucleophile reaction involves ring-opening addition; no smaller by-product molecule (such as hydrogen chloride) is displaced or generated in the reaction.

The acrylamide functionality can offer certain advantages as a polymerizable group over the acrylate. The amide group is known to be more difficult to hydrolyze than the ester group; therefore, amide-functional polymers are expected to be more environmentally stable. Additionally, according to information published in the *Polymer Handbook,* 2nd edition, edited by J. Brandrup and E. H. Immergut, Wiley-Interscience, New York, 1975, pp. II 47–49, acrylamides enjoy rates of free radical polymerization substantially faster than corresponding acrylates or methacrylates. For example, N,N-dimethylacrylamide exhibits a rate of bulk polymerization ($k_p^2/k_t$) at 50° C. 1142 times faster than methyl acrylate and 457 times faster than methyl methacrylate.

The acrylamide derivatized compounds of the present invention also provide an advantage over the previously described acrylamide derivative of anthraquinone in that the compounds of the present invention are more soluble in non-polar monomers because of the longer chain length between the unsaturated group and the carbocycle moiety. The carbon atoms in the chain aid in solubilizing the compounds of the present invention when used in conjunction with non-polar monomers.

DETAILED DESCRIPTION OF PREFERRED EMBODIMENTS

The photoactive crosslinking compound of the present invention has the general formula

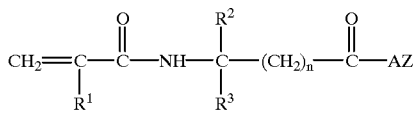

wherein n, $R^1$, $R^2$, $R^3$, A, and Z are defined as above. Preferably, the nucleophilic group (from A) is separated from the ring system of Z by at least one, preferably two, methylene groups.

The various compounds from which Z can be derived are all aromatic ketones. Such ketones are known to be "hydrogen abstracting agents". When activated by absorption of ultraviolet light, these Z groups can act to crosslink various polymer systems.

As mentioned previously, Z is a moiety derived from an acetophenone, benzophenone, anthraquinone, 9-fluorene, anthrone, xanthone, thioxanthone, acridone, dibenzosuberone, benzil, or chromone. These nucleophilic aromatic ketones can be substituted with any functional group that is not a nucleophile (which would interfere in the reaction of the nucleophilic group of the aromatic ketone with the electrophilic azlactone). Potentially useful functional groups include alkyl, alkoxy, aryl, dialkylamino, halo, nitro, and cyano groups.

Preferred Z groups include those derived from an acetophenone, benzophenone, anthraquinone, thioxanthone, chromone, and benzil. Particularly preferred are benzophenone and anthraquinone. Preferred photoactive crosslinking compounds include those where X (in A) is oxygen or NH, and where n is 0. Examples of preferred crosslinking compounds have the general formula

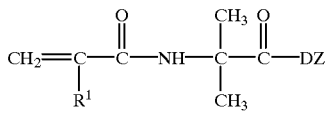

where $R^1$ is H or a methyl group (preferably H), D is $-(OCH_2CH_2O)-$ or $-(NHCH_2CH_2O)-$, and Z is a moiety derived from those compounds listed previously, preferably from an acetophenone, benzophenone, anthraquinone, thioxanthone, chromone, or benzil. Particularly preferred among those compounds of the above formula are those where D is $-(OCH_2CH_2O)-$.

The photoactive crosslinking compound of the present invention can be prepared by the ring-opening of an electrophilic 2-alkenyl azlactone compound and simultaneous reaction with a nucleophile-substituted aromatic ketone. Suitable nucleophiles include hydroxyl, primary amine, secondary amine, and thiol groups.

Alkenyl azlactones can be prepared by methods well known in the art. See, e.g., Iwakura et al., *Tetrahedron*, 23, 3363 (1967); Hubner et al., *Makromol. Chem.*, 11, 109 (1970); Taylor et al., *J. Poly. Sci., Poly. Let. Ed.*, 7, 597 (1969); and U.S. Pat. Nos. 4,304,705 and 4,777,276. These methods involve subjecting an amino acid having the general formula $H_2N(CH_2)_nCR^2R^3COOH$ (wherein n, $R^2$, and $R^3$ are defined as above) to acylation with an ethylenically unsaturated acylating agent having the general formula $H_2C=CR^1C(O)Cl$ (wherein $R^1$ is defined as above) using the method described by, for example, Kulkari et al., *J. Poly. Sci.*, 54, 491 (1961) in which the acylating agent (preferably containing a polymerization inhibitor such as hydroquinone) and an equivalent amount of an acid absorber (e.g., aqueous NaOH) are added portionwise to a chilled (e.g., 0° C.), vigorously stirred aqueous solution of an equimolar amount of an alkali metal salt of the amino acid, followed by neutralization with an aqueous acid (e.g., 6 N HCl), and isolation of the unsaturated peptide carboxylic acid product. This product is then dehydrated by introduction of a dehydrating agent (such as, for example, acetic anhydride, ethyl chloroformate, or dicyclohexylcarbodiimide) to give a 2-alkenyl azlactone.

Because of the wider availability of starting amino acids and their greater thermodynamic stability (reflected in higher synthetic yields), the 5-membered ring species are preferred. Examples of suitable 5-membered ring azlactones include 2-ethenyl-1,3-oxazolin-5-one; 2-ethenyl-4-methyl-1,3-oxazolin-5-one; 2-isopropenyl-1,3-oxazolin-5-one; 2-isopropenyl-4-methyl-1,3-oxazolin-5-one; 2-ethenyl-4,4-dimethyl-1,3-oxazolin-5-one; 2-isopropenyl-4,4-dimethyl-1,3-oxazolin-5-one; 2-ethenyl-4-methyl-4-ethyl-1,3-oxazolin-5-one; 2-isopropenyl-4-methyl-4-ethyl-1,3-oxazolin-5-one; 2-ethenyl-4,4-dibutyl-1,3-oxazolin-5-one; 2-isopropenyl-4-methyl-4-butyl-1,3-oxazolin-5-one; and 2-isopropenyl-4-methyl-4-dodecyl-1,3-oxazolin-5-one, although other such compounds will be apparent to those skilled in the art. Preferred azlactones are 2-ethenyl-4,4-dimethyl-1,3-oxazolin-5-one and 2-isopropenyl-4,4-dimethyl-1,3-oxazolin-5-one.

Nucleophile substituted aromatic ketones that can be used in the present invention include, but are not limited to, the following compounds:

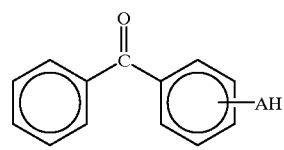

benzophenone

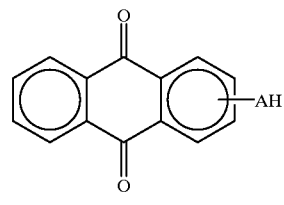

anthraquinone

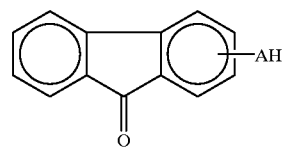

9-fluorenone

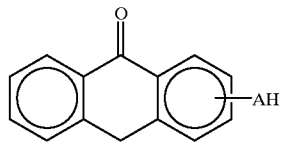

anthrone

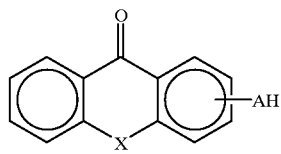

X = O (xanthone),
S (thioxanthone), or
NH (acridone)

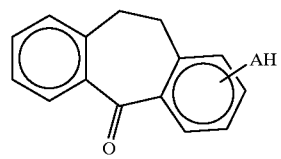

dibenzosuberone

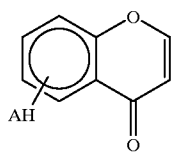

chromone

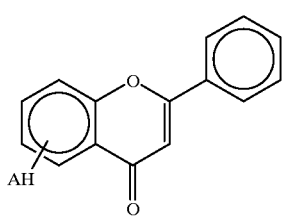

flavone
(a type of chromone)

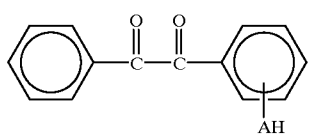

benzil

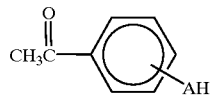

acetophenone wherein A is defined as above.

The ring-opening reaction of the electrophilic azlactone compound and the nucleophile-substituted aromatic ketone can be catalyzed by nitrogen-containing bases, such as bicyclic amidines and guanidines, or trivalent phosphorus compounds. Bases that have been found to be particularly useful catalysts are selected from the group consisting of (a) bicyclic amidines and guanadines having the general formula

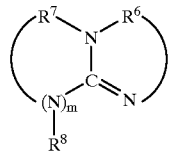

wherein $R^6$ and $R^7$ independently represent an alkylene group or an alkyl- or aryl-substituted alkylene group of 2 to 12 carbon atoms, $R^8$ is an alkyl or aryl group, and m is 0 when the base is an amidine or 1 when the base is a guanidine;

(b) trivalent phosphorus compounds having the formula $R^9R^{10}R^{11}P$ wherein $R^9$, $R^{10}$, and $R^{11}$ are independently H, an alkyl group, an aryl group, an arenyl group, a lower (i.e., 2 to 8 carbon atoms) alkoxy group, or a lower dialkyl amino group; and (c) polymer-bound amidines and phosphines.

Examples of useful amidines include 1,5-diazabicyclo [4.3.0]non-5-ene (DBN)

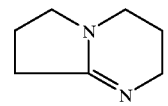

and 1,8-diazabicyclo[5.4.0]undec-7-ene (DBU)

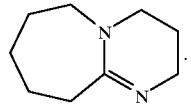

An example of a useful guanidine is 1,5,7-triazabicyclo [4.4.0]dec-5-ene (TBD)

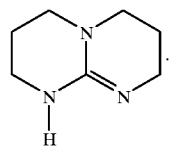

DBN and DBU are available from Aldrich Chemical Co. (Milwaukee, Wis.) while TBD is available from Fluka Chemical Corp. (Ronkonkoma, N.Y.). These and other amidines can also be prepared by methods well known in the art.

Examples of useful trivalent phosphorus compounds include trimethylphosphine, triethylphosphine, triethylphosphite, tributylphosphine, trioctylphosphine, tris (dimethylamino)phospine, dimethylphenylphosphine, diphenylmethylphosphine diphenylphosphine, dipropylphosphine, 1,2-bis(di-n-propylphosphino)ethane, 1,3-bis(diphenylphosphino)propane, diethylmethoxyphosphine, and triphenylphosphine.

The unusual effectiveness of these catalysts is not well understood. The fact that both stronger and weaker bases are less effective as catalysts indicate that factors other than base strength might be important.

When used, the amount of catalyst utilized in the instant process can vary from about 0.1 mole percent (based on the amount of azlactone present) to about 50 mole percent or more. However, 0.5 to 5 mole percent is sufficient to provide a reasonable reaction rate in most instances.

After mixing the alkenyl azlactone and nucleophilic aromatic ketone (optionally in the presence of a catalyst), preferably in equimolar amounts, the reactants are preferably allowed to react at room temperature (about 25° C.) to form the photactive crosslinking compound of the present invention. As those skilled in the art will recognize, these conditions can be modified to maximize yield or rate. For example, reaction temperatures from about 0° C. to about 100° C. or so can be utilized to carry out the process of the instant invention.

In certain cases nonreactive solvents or diluents can be utilized to facilitate or mediate the reaction By "nonreactive" is meant that the solvents do not contain functional groups that can react with either the azlactone, the aromatic ketone, or the catalyst (when present) under the conditions utilized. Suitable nonreactive organic solvents include, for example, ethyl acetate, toluene, xylene, acetone, methyl ethyl ketone, acetonitrile, tetrahydrofuran, hexane, heptane, dimethylformamide, dimethylacetamide, and combinations thereof. In some instances, addition to the reaction mixture of an effective amount (e.g., 0.00005 to 0.5 weight percent based on the combined weight of azlactone and aromatic ketone) of an antioxidant or free radical inhibitor, such as a hindered phenol, can be advantageous.

The photoactive crosslinking compounds of the present invention can be used in the preparation of viscoelastomeric materials, preferably PSAs. This can be accomplished by mixing from about 0.0001 to about 10 parts by weight (pbw) of a photoactive crosslinking compound into 90 to 99.9999 pbw ethylenically unsaturated monomer(s) (such as, for example, acrylic acid and isooctyl acrylate). This can be done either before or after the monomer(s) have been partially polymerized to form a monomer-polymer syrup.

This syrup is preferably of a coatable viscosity and is polymerizable to a viscoelastomeric material that can be crosslinked directly or hot-melt coated (for example, when no polyethylenically unsaturated monomer is present) and then crosslinked. The viscoelastomeric material is preferably a PSA having high shear at both ambient and elevated temperatures. The syrup comprises a solute polymer in a solvent monomer mixture. The polymer preferably has a very high molecular weight (e.g., at least about 100,000), preferably at least 500,000, more preferably at least 750,000, even more preferably at least 1,000,000, most preferably at least 1,500,000. One or both of the polymer and monomer contains at least one radiation-sensitive hydrogen abstracting group (from the photoactive crosslinking compound) that, upon exposure to UV radiation, is activated to enable curing. The cured product is a crosslinked viscoelastomeric material.

The polymer of the syrup contains side chains that comprise radiation-sensitive hydrogen abstracting groups activatable by UV radiation, resulting in a crosslinked viscoelastomeric product.

Where no photoactive crosslinking compound is present in the initial monomer mixture, some polymer that includes side chains comprising the aforementioned radiation-sensitive hydrogen abstracting groups or some photoactive crosslinking compound must be added to the syrup prior to formation of the viscoelastomeric material therefrom, i.e., polymerization of the monomer(s) of the monomer mixture. Preferably, however, the solute polymer is prepared in situ, i.e., directly from the solvent monomer mixture. This eliminates the need for solubilizing a separately made polymer in a monomer mixture and allows very high molecular weight polymers to be formed and solubilized.

Crosslinked viscoelastomeric materials produced from such a syrup can be used as PSAs, vibration damping materials, transfer adhesives, structural adhesives, protective coatings, and the like. Advantageously, such a syrup can have a coatable viscosity and can therefore be applied to a substrate prior to curing, thus allowing for the simple production of articles comprising one or more layers of the aforementioned viscoelastomeric material.

Preferably, a saturated energy-activated initiator of polymerization is used in forming the polymer component of the syrup from the solvent monomer component. These energy-activated sources can be either heat- or UV radiation-activated. Examples of heat-activated sources include benzoyl peroxide, t-butyl perbenzoate, cumene hydroperoxide, azobis(isobutyronitrile), and methyl ethyl ketoperoxide. Useful UV radiation-activated initiators include the benzoin ethers such as benzoin methyl ether and benzoin ispropyl ether; substituted acetophenones such as 2,2-diethoxyacetophenone, commercially available as Irgacure™ 651 photoinitiator (Ciba-Geigy Corp.; Ardsley, N.Y.), 2,2-dimethoxy-2-phenyl-1-phenylethanone, commercially available as Esacure™ KB-1 photoinitiator (Sartomer Co.; West Chester, Pa.), and dimethoxyhydroxyacetophenone; substituted α-ketols such as 2-methyl-2-hydroxy propiophenone; aromatic sulfonyl chlorides such as 2-naphthalenesulfonyl chloride; and photoactive oximes such as 1-phenyl-1,2-propanedione-2-(O-ethoxycarbonyl) oxime. Particularly preferred among these are the substituted acetophenones. A saturated energy-activated source of free radicals can be present in an amount from 0.0001 to about 3 pbw, preferably from about 0.001 to about 1.0 pbw, more preferably from about 0.005 to about 0.5 pbw, per 100 pbw of the solvent monomer mixture.

When present and upon activation through introduction of appropriate energy, the saturated energy-activated initiator of polymerization initiates the polymerization of the free radically-polymerizable ethylenically unsaturated monomers. When a photoactive crosslinking compound is also present, it also can be incorporated into the backbone chain of the polymer, resulting in radiation-sensitive hydrogen abstracting groups pendent from the backbone chain.

Where a saturated heat-activated initiator is used with a monomer mixture that includes at least one photoactive crosslinking compound, the syrup can be exposed to heat only or to heat and UV radiation so as to initiate polymerization of the monomer mixture.

One or more free radically-polymerizable polyethylenically unsaturated monomers can be included in the monomer mixture or, preferably, added to the syrup. Use of such monomer(s) allows for a reduction in the amount of photoactive crosslinking compound necessary to produce a viscoelastomeric material.

Although viscoelastomeric films can be prepared directly from the solvent monomer mixture (by quickly polymerizing a coated layer of the monomer to a polymer/monomer mixture), increasing the viscosity of the monomer mixture to a level more suitable for coating is preferred. This is readily accomplished by exposing the monomer(s) to a source of energy until about 0.1 to 35% (by wt.), preferably about 1 to 10% (by wt.), more preferably about 3 to 7% (by wt.), of the monomers have polymerized. If the source of energy is heat, a heat-activated initiator of free radicals can be included in the composition. If the source of energy is UV radiation, a radiation-activated source of free radicals can be used but is not absolutely required where a monomer of the monomer mixture contains a radiation sensitive group that produces free radicals on exposure to suitable radiation. Use of a radiation-activated source of free radicals is preferred in such situations, however.

The syrup is preferably prepared in situ by mixing one or more free radically-polymerizable ethylenically unsaturated monomers and 0 to 3 pbw of one or more of the photoactive crosslinking compounds and then polymerizing the monomer(s) to form a solute polymer. The monomers can be added in any order. Where no radiation-sensitive hydrogen abstracting groups are present in either the solute polymer or the solvent monomer mixture, some of these groups must be introduced into the syrup prior to formation of the viscoelastomeric material. This can be done by adding photoactive crosslinking compound to the composition after formation of the solute polymer or by adding to the syrup a second polymer (made separately from the syrup) that contains mer units with the above-described radiation-sensitive hydrogen abstracting groups pendent therefrom. Adjuvants, when desired, can thereafter be blended into the mixture.

A syrup of a coatable viscosity can be applied to a substrate, preferably a flexible carrier web, using any conventional coating means such as roller coating, dip coating, knife coating, and extrusion coating. The substrate can further comprise a release coating between the substrate and the syrup or on the side of the substrate opposite the side on which the syrup is coated.

Once a syrup has been prepared, a crosslinked viscoelastomeric material can be prepared therefrom in a variety of ways. In each method, however, the remaining monomer(s) in the syrup are polymerized by exposure to radiation that activates the hydrogen abstracting groups and facilitates crosslinking.

One way to make the viscoelastomeric material from the remaining monomer(s) is to irradiate the syrup with both high and low intensity UV radiation. Low intensity radiation is defined as 10 mW/cm$^2$ or less (as measured in accordance with procedures approved by the United States National Institute of Standards and Technology as, for example, with a UVIMAP™ UM 365 L-S radiometer manufactured by Electronic Instrumentation & Technology, Inc., in Sterling, Va.), preferably in the wavelength region of 200 to 600 nm, preferably 280 to 400 nm. High intensity radiation is defined as anything greater than 10 mW/cm$^2$, preferably between 15 and 450 mW/cm$^2$. When such radiation is used, the viscoelastomeric material can be formed directly from the syrup.

Other ways of making the viscoelastomeric material involve initially exposing the syrup to only low intensity radiation. Syrup formulations that produce high performance viscoelastomeric materials will depend on the particular crosslinker and its ability to be activated by the particular radiation used.

Polymerization is preferably performed in an inert (i.e., oxygen free) atmosphere, such as a nitrogen atmosphere. Tolerance to oxygen can be increased by including in the syrup an oxidizable tin compound, as is taught in U.S. Pat. No. 4,303,485.

A monomer-polymer syrup can be cured in air by covering a layer of the photoactive coating with a plastic film that is substantially transparent to UV radiation but impervious to oxygen and irradiating the composition through that film using UV lamps that emit light in the wavelength range corresponding to the absorption maximum of the hydrogen abstracting groups and saturated photoinitiator. Several different commercially available lamps, including medium pressure mercury lamps and low-intensity fluorescent lamps, can be used. The radiation intensity of these lamps is preferably adjusted so that the radiation intensity at the surface of the coating is less than 20 mW/cm$^2$, preferably 0.5 to 6 mW/cm$^2$, each having emission maxima between 200 and 600 nm, preferably between 280 and 400 nm. Maximum efficiency and rate of polymerization are dictated by the relationship between emission properties of the radiation source and absorption properties of the photoactive compounds employed.

Where the saturated energy-activated initiator in the syrup is heat-activated, the syrup preferably is exposed to a heat source either before or simultaneously with exposure to radiation of a wavelength that activates the hydrogen abstracting groups present in the monomer and/or the polymer of the syrup.

Where the energy-activated initiator in the syrup is a saturated UV radiation-activated initiator, the syrup preferably is exposed first to a wavelength of radiation that activates the saturated initiator until the monomers polymerize to a coatable viscosity so that the syrup can be coated on a substrate. This coated composition is exposed to radiation of a wavelength to which at least the hydrogen abstracting group of the photoactive crosslinking compound is sensitive at an intensity of less than 100 mW/cm$^2$ (for a total dose of 30 to 2000 mJ/cm$^2$), preferably 20 mW/cm$^2$ (for a total dose of 50 to 1000 mJ/cm$^2$) so as to further polymerize the monomers as well as crosslink the polymer chains.

Further details of this syrup process can be found in assignee's copending PCT application US95/09502 (PCT publication No. WO96/05249).

Objects and advantages of this invention are further illustrated by the following examples. The particular materials and amounts, as well as other conditions and details, recited in these examples should not be used to unduly limit this invention.

EXAMPLES

Example 1

Preparation of 4-[2-(N-2-propenoyl)amino-2-methylpropanoyloxy]benzophenone

To a 250 mL round bottom flask were added 6.95 g (0.05 mole) 2-vinyl-4,4-dimethylazlactone (hereinafter "VDM", obtained from SNPE, Inc.; Princeton, N.J.), 9.90 g (0.05 mole) 4-hydroxy-benzophenone (Aldrich Chemical Co.; Milwaukee, Wis.), and 50 mL ethyl acetate. This solution was magnetically stirred at room temperature while 0.38 g (0.00025 mole) DBU was added.

The solution immediately turned yellow and, within 30 minutes, an insoluble powdery white solid formed. This solid was collected by filtration, washed with cold ethyl acetate, and dried in vacuo. A total of 12.45 g was collected (74% yield), a sample of which was found to have a melting point of 131–131.5° C.

IR and NMR spectroscopy were used to identify the product as 4-[2-(N-2-propenoyl)amino-2-methylpropanoyloxy]benzophenone (i.e., AcBP).

Examples 2–21

Comparison of ABP and AcBP

To a series of glass jars were added 90 pbw IOA, 10 pbw AA, and 0.04 pph 2,2dimethoxy-2-phenyl-1-phenylethanone (Ciba-Geigy Corp.; Ardsley, N.Y.). To some of the jars were added varying amounts of acryloxybenzophenone (hereinafter "ABP") made according to the procedures known in the art Examples 2–6), or AcBP (Examples 12–16). (To other of the jars, ABP or AcBP was not added until after the contents of the jar had been partially polymerized so as to provide a syrup.) Each jar was purged with nitrogen and the contents exposed to low intensity UV radiation so as to partially polymerize the monomers and form coatable mixtures. An additional 0.12 pph 2,2-dimethoxy-2-phenyl-1-phenylethanone and 0.05 pph HDDA were added to each jar, and varying amounts of ABP (Examples 7–11) or AcBP (Examples 17–21) were added to the jars to which no ABP or AcBP had previously been added. (Although the amounts by weight of AcBP are higher than those of ABP, the moles of each initiator were identical.)

Each mixture was coated on polyethylene-coated silicone treated paper release liner at a thickness of 0.13 mm while the oxygen level of the curing chamber was maintained at about 200 ppm, each coated mixture was exposed to low intensity radiation for about 104 seconds at an average intensity of 2.0 mW/cm$^2$. Both shear strength and peel strength measurements were then taken. A 200 mJ/cm$^2$ high intensity exposure at an average intensity of 18 mW/cm$^2$ was thereafter applied and the peel strength values were again measured.

The test procedures were the same as described above with the exception that the stainless steel peel test was performed 20 minutes after the adhesive films were applied to the substrates.

TABLE I

| | Initiator (pbw) | | Low Intensity Radiation Only | | | Low and High Intensity Radiation | | |
|---|---|---|---|---|---|---|---|---|
| | Added to monomer | Added to | Shear Strength (min) | | Peel | Shear Strength (min) | | Peel |
| Ex. No. | mixture | the syrup | RT | 70° C. | (N/dm) | RT | 70° C. | (N/dm) |
| 2 | 0.0075 | — | 3793 | 50 | 218 | 4006 | 57 | 187 |
| 3 | 0.05 | — | 5528 | 57 | 191 | 10,000+ | 477 | 184 |
| 4 | 0.10 | — | 7247 | 71 | 185 | 10,000+ | 10,000+ | 187 |
| 5 | 0.15 | — | 10,000+ | 181 | 210 | 10,000+ | 10,000+ | 188 |
| 6 | 0.20 | — | 10,000+ | 4911 | 214 | 10,000+ | 10,000+ | 175 |
| 7 | — | 0.0075 | 2257 | 38 | 187 | 3221 | 51 | 203 |
| 8 | — | 0.05 | 3620 | 46 | 195 | 8680 | 79 | 182 |
| 9 | — | 0.10 | 90 | 6 | 134 | 1937 | 35 | 132 |
| 10 | — | 0.15 | 4047 | 62 | 189 | 10,000+ | 109 | 184 |
| 11 | — | 0.20 | 5364 | 48 | 208 | 10,000+ | 93 | 195 |
| 12 | 0.01 | — | 4981 | 46 | 182 | 4180 | 41 | 178 |
| 13 | 0.067 | — | 3084 | 40 | 174 | 10,000+ | 2883 | 166 |
| 14 | 0.133 | — | 7295 | 50 | 179 | 10,000+ | 10,000+ | 181 |
| 15 | 0.20 | — | 10,000+ | 114 | 181 | 10,000+ | 10,000+ | 172 |
| 16 | 0.267 | — | 10,000+ | 195 | 180 | 10,000+ | 10,000+ | 181 |
| 17 | — | 0.01 | 3705 | 41 | 168 | 4706 | 29 | 189 |
| 18 | — | 0.067 | 4314 | 36 | 176 | 10,000+ | 47 | 182 |
| 19 | — | 0.133 | 5893 | 35 | 173 | 10,000+ | 124 | 177 |
| 20 | — | 0.20 | 5432 | 56 | 167 | 10,000+ | 84 | 180 |
| 21 | — | 0.267 | 5968 | 45 | 182 | 10,000+ | 81 | 175 |

The data of Table I show that AcBP acts as an initiator of ethylenically unsaturated monomer systems in much the same way and with at least as much efficiency as does ABP.

Example 22

3-[2-(N-2-propenoyl)amino-2-methylpropanoyloxy] acetophenone (AcAc)

A mixture of 27.2 g (0.20 mol) 3-hydroxyacetophenone (Aldrich Chemical Co.), 27.8 g (0.20 mol) VDM and 0.50 g (3.3 mmol) DBU was heated at 90° C. for about 18 hours. The product was recrystallized from aqueous ethanol to afford 30.7 g (55%) of the acrylamide as a white solid, with a melting point of 115–117° C. IR and NMR spectra were consistent with those expected for the desired product.

Examples 23–28

Testing of AcAc

Syrups including AcAc were coated, polymerized, and tested in the same manner as described in Examples 2–21. The results are given below in Table II. (All samples were exposed to high intensity radiation).

TABLE II

| | AcAc (pbw) | | Shear Strength (min) | |
|---|---|---|---|---|
| Example No. | Added to monomers | Added to the syrup | RT | 70° C. |
| 23 | 0.1 | — | 1105 | 25 |
| 24 | 0.3 | — | 1948 | 34 |
| 25 | 0.5 | — | 2595 | 49 |
| 26 | — | 0.1 | 4129 | 90 |
| 27 | — | 0.3 | 1883 | 105 |
| 28 | — | 0.5 | 10,000+ | 4162 |

The data of Table II show that AcAc can act as a reactive photocrosslinker. Improvement of shear values is believed to be possible through optimization of light source.

Example 29

2-(2-thioxanthonoxy)ethyl-2-propen-2-oylamino-2-methylpropanoate

The description in Example 1 of U.S. Pat. No. 4,459,416 was used to prepare 2-hydroxythioxanthone. In a 250 mL round bottom flask equipped with a magnetic stirring bar and a mineral oil sealed exit gas bubbling device were charged 12.97 g (56.8 mmol) 2-hydroxythioxanthone, 7.5 g (85.3 mmol) ethylene carbonate, and 5.74 g (56.8 mmol) triethylamine. After heating (with stirring) the mixture to 90° C., evolution of a gas was observed. As reaction proceeded, the mixture became a black homogeneous liquid. After about 24 hours, thin layer chromatography using silica gel coated glass plates (30:70 ethyl acetate-heptane developing solvent) revealed that the starting phenol could no longer be detected.

Much of the triethylamine was removed in vacuo, and the black residue was extracted with two 100 mL portions of boiling toluene. The upper toluene layers were decanted and allowed to cool. The yellow needles that formed were recrystallized from ethyl acetate to provide 8.25 g (54% yield) of 2-(2-hydroxyethoxy)thioxanthone having a melting point of 144–144.5° C. The structure of this compound was confirmed by IR and NMR spectroscopy.

To complete synthesis of the propanoate, 1.72 g (6.3 mmol) 2-(2-hydroxyethoxy)thioxanthone, 1.32 g (9.5 mmol) 2-vinyl-4,4-dimethylazlactone, 0.048 g (0.3 mmol) DBU, and 25 mL heptane were stirred vigorously at room temperature for about 24 hours. During this time, the yellow needles of the thioxanthone were transformed into a pasty lime yellow powder. After a total of about 48 hours, the mixture was filtered and $^1$H-NMR indicated about 80% conversion to the desired product. Additional VDM and DBU charges were added along with 100 mL of heptane, and stirring continued for an additional five days at room temperature.

Filtration and drying of the yellow solid yielded 2.34 g (90% yield) of product that was free of impurities as determined by $^1$H-NMR. The solid melted at 146–147° C. and was identified as the title compound based on spectral information and its mass spectrum, which produced an accurate mass confirming the molecular formula of $C_{22}H_{21}NSO_5$.

Example 30–36

Testing of 2-(2-thioxanthonoxy)ethyl-2-propen-2-oylamino-2-methylpropanoate

To a series of glass jars were added 90 pbw IOA, 10 pbw AA, and 0.04 pph 2,2-dimethoxy-2-phenyl-1-phenylethanone. To some of the jars were added varying amounts of 2-(2-thioxanthonoxy)ethyl-2-propen-2-oylamino-2-methylpropanoate (hereinafter "TXAM") from Example 29. To other of the jars, TXAM was not added until after the contents of the jar had been partially polymerized so as to provide a syrup. No TXAM was added to one of the jars (Ex. No. 30), so this sample was a comparative example only.

Each jar was purged with nitrogen and the contents exposed to low intensity UV radiation so as to partially polymerize the monomers and form coatable mixtures. To each mixture was added an additional 0.12 pph 2,2-dimethoxy-2-phenyl-1-phenylethanone, and some of the mixtures had 0.08 pph HDDA added thereto. To the jars to which no TXAM had been added previously (other than the comparative example), varying amounts of TXAM now were added.

Each mixture was coated on polyethylene-coated silicone treated paper release liner at a thickness of 0.10 mm. The oxygen level of the curing chamber was maintained at about 200 ppm. Each of the coated mixtures were exposed to low intensity radiation until they had received a total energy does of 250 mJ/cm$^2$ (as measured according to the procedures described in the Detailed Description section). These coated mixtures then were cut in half. One half of these were exposed to radiation (total dose of 400 mJ/cm$^2$) from a V-type bulb (Fusion Systems Corp.; Rockville, Md.) which has maximum spectral output in the range of 325 to 450 nm, while the other half were exposed to radition from an H-type bulb (Fusion Systems) which has maximum spectral output in the range of 200 to 325 nm.

The test procedures were the same as described above.

TABLE III

| | TXAM (pbw) | | | Low intensity radiation shear strength (min) | | High intensity radiation shear strength (min) | | | |
|---|---|---|---|---|---|---|---|---|---|
| | Added to | Added | | | | H-bulb | | V-bulb | |
| Ex. No. | monomer mixture | to the syrup | HDDA (pbw) | RT | 70° C. | RT | 70° C. | RT | 70° C. |
| 30 | 0 | 0 | 0.08 | 2230 | 35 | — | — | — | — |
| 31 | 0.05 | 0 | 0.08 | 10,000+ | 155 | 10,000+ | 10,000+ | 10,000+ | 10,000+ |
| 32 | 0.1 | 0 | 0 | 75 | 5 | 2237 | 115 | 10,000+ | 10,000+ |
| 33 | 0.2 | 0 | 0 | 43 | 2 | 3660 | 235 | 10,000+ | 10,000+ |
| 34 | 0 | 0.05 | 0.08 | 10,000+ | 268 | 10,000+ | 10,000+ | 10,000+ | 10,000+ |
| 35 | 0 | 0.1 | 0 | 175 | 8 | 6109 | 345 | 10,000+ | 10,000+ |
| 36 | 0 | 0.2 | 0 | 69 | 8 | 8220 | 1010 | 10,000+ | 10,000+ |

The data of Table III show that TXAM can act as an efficient photocrosslinker, especially when added to a partially polymerized syrup. Use of high intensity light can result in PSAs with excellent shear performance at both room and elevated temperatures. This is especially true with the type of radiation produced by a bulb having a maximum spectral output in the range of 325 to 450 nm because TXAM has a wavelength of maximum absorption of about 401 nm.

Example 37

2-(2-fluorenyloxy)ethyl-2-propen-2-oylamino-2-methylpropanoate

Following the procedure described in Example 29, 2-hydroxyfluoren-9-one (Aldrich) was reacted with ethylene carbonate and triethylamine to obtain 2-hydroxyethoxyfluoren-9-one (63% yield), with a melting point of 118–119° C. The title compound, with a melting point of 131.5–133° C., was obtained in 96% yield by the previously described DBU-catalyzed reaction with VDM in heptane.

Examples 38–44

Testing of 2-(2-fluorenyloxy)ethyl-2-propen-2-oylamino-2-methylpropanoate

To a series of glass jars were added 90 pbw IOA, 10 pbw AA, and 0.04 pph 2,2-dimethoxy-2-phenyl-1-phenylethanone. To some of the jars were added varying amounts of 2-(2-fluorenyloxy)ethyl-2-propen-2-oylamino-2-methylpropanoate (hereinafter "FLAM") from Example 37. To other of the jars, FLAM was not added until after the contents of the jar had been partially polymerized so as to provide a syrup. No FLAM was added to one of the jars (Ex. No. 38), so this sample was a comparative example only.

Each jar was purged with nitrogen and the contents exposed to low intensity UV radiation so as to partially polymerize the monomers and form coatable mixtures. To each mixture was added an additional 0.12 pph 2,2-dimethoxy-2-phenyl-1-phenylethanone, and some of the mixtures had 0.08 pph HDDA added thereto. To the jars to which no FLAM had been added previously (other than the comparative example), varying amounts of FLAM now were added.

Each mixture was coated on polyethylene-coated silicone treated paper release liner at a thickness of 0.10 mm. The oxygen level of the curing chamber was maintained at about 200 ppm. Each of the coated mixtures were exposed to low intensity radiation until they had received a total energy does of 250 mJ/cm². These coated mixtures then were cut in half and exposed to the special bulbs described in Examples 30–36.

The test procedures were the same as described above.

TABLE IV

| | FLAM (pbw) | | | Low intensity radiation shear strength (min) | | High intensity radiation shear strength (min) | | | |
|---|---|---|---|---|---|---|---|---|---|
| | Added to | Added | | | | H-bulb | | V-bulb | |
| Ex. No. | monomer mixture | to the syrup | HDDA (pbw) | RT | 70° C. | RT | 70° C. | RT | 70° C. |
| 38 | 0 | 0 | 0.08 | 2230 | 35 | — | — | — | — |
| 39 | 0.05 | 0 | 0.08 | 10,000+ | 140 | 10,000+ | 5500 | 10,000+ | 10,000+ |
| 40 | 0.1 | 0 | 0 | 10,000+ | 12 | 10,000+ | 15 | 10,000+ | 2304 |
| 41 | 0.2 | 0 | 0 | 10,000+ | 29 | 10,000+ | 35 | 10,000+ | 5400 |
| 42 | 0 | 0.05 | 0.08 | 10,000+ | 119 | 10,000+ | 3589 | 10,000+ | 10,000+ |

TABLE IV-continued

| | FLAM (pbw) | | | Low intensity radiation shear strength (min) | | High intensity radiation shear strength (min) | | | |
|---|---|---|---|---|---|---|---|---|---|
| | Added to | Added | | | | H-bulb | | V-bulb | |
| Ex. No. | monomer mixture | to the syrup | HDDA (pbw) | RT | 70° C. | RT | 70° C. | RT | 70° C. |
| 43 | 0 | 0.1 | 0 | 10,000+ | 16 | 10,000+ | 34 | 10,000+ | 10,000+ |
| 44 | 0 | 0.2 | 0 | 10,000+ | 15 | 10,000+ | 75 | 10,000+ | 10,000+ |

The data of Table IV show that FLAM can act as an efficient photocrosslinker, especially when added to a partially polymerized syrup. Use of high intensity light can result in PSAs with excellent shear performance at both room and elevated temperatures. This is especially true with the type of radiation produced by a bulb having a maximum spectral output in the range of 325 to 450 nm because FLAM has a wavelength of maximum absorption of about 430 nm.

Example 45

2-(7-flavoneoxy)ethyl-2-propen-2-oylamino-2-methylpropanoate

In an analogous fashion to 2-hydroxyethoxythioxanthone in Example 29, 7-hydroxyflavone (Aldrich) was reacted with ethylene carbonate and triethylamine to obtain 7-hydroxyethoxyflavone (83% yield). This product was dissolved in THF. One equivalent of VDM and several drops of DBU were added. The reaction mixture was stirred overnight.

Solvent was removed and an $^1$H-NMR spectrum determined that the reaction was incomplete. An additional 1.5 g neat VDM and 3 drops of DBU were added, and the mixture was allowed to stir overnight. Excess VDM was removed under vacuum and the product was recrystallized from a mixture of ethanol and petroleum ether to give 1.26 g (56% yield) of a white solid. The structure of the compound was confirmed by $^1$H-NMR, $^{13}$C-NMR, and IR analysis.

phenylethanone. To some of the jars were added varying amounts of 2-(7-flavoneoxy)ethyl-2-propen-2-oylamino-2-methylpropanoate (hereinafter "PCAM") from Example 45. To other of the jars, PCAM was not added until after the contents of the jar had been partially polymerized so as to provide a syrup. No PCAM was added to one of the jars (Ex. No. 46), so this sample was a comparative example only.

Each jar was purged with nitrogen and the contents exposed to low intensity UV radiation so as to partially polymerize the monomers and form coatable mixtures. To each mixture was added an additional 0.12 pph 2,2-dimethoxy-2-phenyl-1-phenylethanone, and some of the mixtures had 0.08 pph HDDA added thereto. To the jars to which no PCAM had been added previously (other than the comparative example), varying amounts of PCAM now were added.

Each mixture was coated on polyethylene-coated silicone treated paper release liner at a thickness of 0.10 mm. The oxygen level of the curing chamber was maintained at about 200 ppm. Each of the coated mixtures were exposed to low intensity radiation until they had received a total energy does of 250 mJ/cm$^2$. These coated mixtures then were cut in half. One half were exposed to the H-type bulb described in Examples 30–36 until a total dose of 200 mJ/cm$^2$ was received while the other half were exposed until a total dose of 400 mJ/cm$^2$ was received.

The test procedures were the same as described above.

TABLE V

| | PCAM (pbw) | | | Low intensity radiation shear strength (min) | | H-bulb exposure, shear strength (min) | | | |
|---|---|---|---|---|---|---|---|---|---|
| | Added to | Added | | | | 200 mJ/cm$^2$ | | 400 mJ/cm$^2$ | |
| Ex. No. | monomer mixture | to the syrup | HDDA (pbw) | RT | 70° C. | RT | 70° C. | RT | 70° C. |
| 46 | 0 | 0 | 0.08 | 2230 | 35 | — | — | — | — |
| 47 | 0.05 | 0 | 0.08 | 10K+ | 10K+ | 10,000+ | 10,000+ | 10,000+ | 10,000+ |
| 48 | 0.1 | 0 | 0 | 88 | 6 | 230 | 15 | 10,000+ | 23 |
| 49 | 0.2 | 0 | 0 | 123 | 11 | 238 | 15 | 10,000+ | 30 |
| 50 | 0 | 0.05 | 0.08 | 10K+ | 10K+ | 10,000+ | 10,000+ | 10,000+ | 10,000+ |
| 51 | 0 | 0.1 | 0 | 1 | 0 | 6 | 0 | 10,000+ | 0 |
| 52 | 0 | 0.2 | 0 | 0 | 0 | 3 | 0 | 10,000+ | 0 |

Examples 46–52

Testing of 2-(7-flavoneoxy)ethyl-2-propen-2-oylamino-2-methylpropanoate

To a series of glass jars were added 90 pbw IOA, 10 pbw AA, and 0.04 pph 2,2-dimethoxy-2-phenyl-1-

The data of Table V show that PCAM can act as an efficient photocrosslinker, especially when used in combination with a polyunsaturated compound such as HDDA. Use of high intensity light can result in PSAs with excellent shear performance at room temperature.

Example 53

4-trimethylsilyloxybenzaldehyde

To a stirred solution of 122 g 4-hydroxybenzaldehyde (1.0 mol, available from Aldrich) and 111 g triethylamine (1.1 mol, available from Aldrich) in 1.0 L dichloromethane was added dropwise 108 g chlorotrimethylsilane (1.1 mol). This mixture was allowed to stand at room temperature for three days before 500 mL hexane was added. The mixture was filtered to remove triethylamine hydrochloride, and most of the solvent was removed at reduced pressure. A 200 mL portion of hexane was then added, the mixture filtered again, and solvent removed at reduced pressure to leave the desired product.

Example 54

4-trimethylsilyloxy-α-trimethylsilyloxyphenylacetonitrile

In a 2 L round bottom flask were stirred 65 g (1.0 mmol) potassium cyanide and 264 g 1,4,7,10,13,16-hexaoxacyclooctadecane (Aldrich) in 10 mL methanol for 10 minutes. The methanol was then evaporated and the product from the previous example and 500 mL dichloromethane were added. This solution was stirred at room temperature while a solution of 99 g (1.0 mol) cyanotrimethylsilane (Hüls America, Inc.; Piscataway, N.J.) in 200 mL dichloromethane was added dropwise. When addition was complete, the solution was allowed to stand at room temperature for several days before being distilled. The product was collected over a boiling point range of 148–152° C. at 560 N/m$^2$.

Example 55

4-hydroxybenzoin

Following the method of Krepski et al., *Tetrahedron Lett.*, 1983, 24, 4075–78, 185 mL of a 3.0 M phenylmagnesium bromide solution in diethyl ether (Aldrich) was added to a stirred solution of 143 g (0.49 mol) 4-trimethylsilyloxy-α-trimethylsilyloxyphenylacetonitrile from Example 54 in 1.0 L diethyl ether at 0° C. When addition was complete, the solution was allowed to stand at room temperature overnight before 50 mL water was added slowly.

The ethereal solution was extracted three times with 200 mL portions of a 10% HCl solution in water. The aqueous extracts were combined and allowed to stand overnight at room temperature. The solid that separated from the aqueous solution was filtered off and recrystallized from aqueous ethanol to afford the desired product.

Example 56

4-hydroxybenzil

Following the general method of Girard et al., *Tetrahedron Lett.*, 1975, 4513–14, a mixture of 2.2 g (10 mmol) 4-hydroxybenzoin from Example 55, 0.9 g (2 mmol) ytterbium nitrate pentahydrate (Aldrich), 17 mL dimethoxyethane, 7 mL water, and 8 mL concentrated HCl was heated under reflux for about six hours.

After the addition of 75 mL ethyl acetate, the solution was washed with several 75 mL portions of saturated aqueous sodium bicarbonate solution, decolorized by boiling with 10 g charcoal, dried over magnesium sulfate, and filtered. Solvent was evaporated to leave the desired product.

Example 57

(4-oxybenzil)-2-propen-2-oylamino-2-methylpropanoate

A mixture of 3.0 g (13 mmol) 4-hydroxybenzil from Example 56, 1.9 g (13.6 mmol) VDM, and 4 drops of DBU was heated overnight at 75° C. The resultant solid was extracted with ethanol. Chromatography of the extract on silica gel (eluted with 5% methanol in dichloromethane) afforded 1.4 g of the desired product.

Examples 58–64

Testing of (4-oxybenzil)-2-propen-2-oylamino-2-methylpropanoate

To a series of glass jars were added 90 pbw IOA, 10 pbw AA, and 0.04 pph 2,2-dimethoxy-2-phenyl-1-phenylethanone. To some of the jars were added varying amounts of (4-oxybenzil)-2-propen-2-oylamino-2-methylpropanoate (hereinafter "BZAM") from Example 57. To other of the jars, BZAM was not added until after the contents of the jar had been partially polymerized so as to provide a syrup. No BZAM was added to one of the jars (Ex. No. 58), so this sample was a comparative example only.

Each jar was purged with nitrogen and the contents exposed to low intensity UV radiation so as to partially polymerize the monomers and form coatable mixtures. To each mixture was added an additional 0.12 pph 2,2-dimethoxy-2-phenyl-1-phenylethanone, and some of the mixtures had 0.08 pph HDDA added thereto. To the jars to which no BZAM had been added previously (other than the comparative example), varying amounts of BZAM now were added.

Each mixture was coated on polyethylene-coated silicone treated paper release liner at a thickness of 0.10 mm. The oxygen level of the curing chamber was maintained at about 200 ppm. Each of the coated mixtures were exposed to low intensity radiation until they had received a total energy does of 250 mJ/cm$^2$. These coated mixtures then were cut in half and exposed to the special bulbs described in Examples 30–36.

The test procedures were the same as described above.

TABLE VI

| Ex. No. | BZAM (pbw) Added to monomer mixture | BZAM (pbw) Added to the syrup | HDDA (pbw) | Low intensity radiation shear strength (min) | | H-bulb exposure, shear strength (min) | | | |
|---|---|---|---|---|---|---|---|---|---|
| | | | | | | 200 mJ/cm² | | 400 mJ/cm² | |
| | | | | RT | 70° C. | RT | 70° C. | RT | 70° C. |
| 58 | 0 | 0 | 0.08 | 2230 | 35 | — | — | — | — |
| 59 | 0.05 | 0 | 0.08 | 7533 | 523 | 10,000+ | 10,000+ | 10,000+ | 10,000+ |
| 60 | 0.1 | 0 | 0 | 75 | 2 | 136 | 5 | 48 | 8 |
| 61 | 0.2 | 0 | 0 | 22 | 1 | 76 | 5 | 78 | 4 |
| 62 | 0 | 0.05 | 0.08 | 5543 | 486 | 10,000+ | 10,000+ | 10,000+ | 10,000+ |
| 63 | 0 | 0.1 | 0 | 78 | 6 | 109 | 5 | 162 | 5 |
| 64 | 0 | 0.2 | 0 | 69 | 5 | 220 | 10 | 134 | 6 |

The data of Table VI show that BZAM can act as an efficient photocrosslinker, especially when used in combination with a polyunsaturated compound such as HDDA.

Various modifications and alterations that do not depart from the scope and spirit of this invention will become apparent to those skilled in the art. This invention is not to be unduly limited to the illustrative embodiments set forth herein.

What is claimed is:

1. A photoactive crosslinking compound having the general formula:

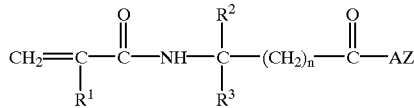

wherein
   $R^1$ is H or a $C_1$ to $C_3$ alkyl group;
   $R^2$ and $R^3$ are independently H, an alkyl group having 1 to 14 carbon atoms, a cycloalkyl group having 3 to 14 carbon atoms, an aryl group having 5 to 12 ring atoms, an arenyl group having 6 to 26 carbon atoms and 0 to 3 S, N, and nonperoxidic O heteroatoms, or $R^2$ and $R^3$ taken together with the carbon to which they are attached form a carbocyclic ring containing 4 to 12 ring atoms;
   n is 0 or 1;
   A is $XCR^4R^5$, $[X(CH_2CHR^1)]_m$, or $X—[(CH_2CHR^1Y)]_m$ where X is O, S, NH, or $NR^4$; Y is O, C(O)O, OC(O)NH, OC(O)O, or NHC(O)O; $R^4$ and $R^5$ are independently H, a $C_1$ to $C_6$ alkyl group, or an aryl group; and m is 0 or 1; and
   Z is a nitrogen abstracting moiety derived from benzophenone or anthraquinone.

2. The compound of claim 1 wherein X is oxygen or NH.

3. The compound of claim 1 wherein n is 0.

4. The compound of claim 1 wherein $R^2$ and $R^3$ are both methyl groups.

5. The compound of claim 1 having the formula

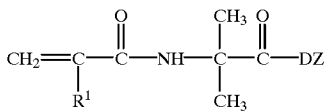

wherein $R^1$ is H or a methyl group, D is $-(OCH_2CH_2O)-$ or $-(NHCH_2CH_2O)-$, and Z is a moiety derived from benzophenone or anthraquinone.

6. The compound of claim 5 wherein $R^1$ is H.

7. The compound of claim 5 wherein D is $-(OCH_2CH_2O)-$.

8. A method of making the photoactive crosslinking compound of claim 1 comprising the steps of solubilizing and allowing to react a 2-alkenyl azlactone compound and a nucleophilic benzophenone or anthraquinone.

9. The method of claim 8 wherein said 2-alkenyl azlactone compound and said nucleophilic benzophenone or anthraquinone are present in approximately equimolar amounts.

10. The method of claim 8 wherein said 2-alkenyl azlactone compound and said nucleophilic benzophenone or anthraquinone are reacted in the presence of a nitrogen-containing base or a trivalent phosphorus compound.

11. The method of claim 10 wherein said nitrogen-containing base is a bicyclic amidine or guanidine compound.

12. The method of claim 10 wherein said nitrogen-containing base or trivalent phosphorus compound is present in an amount up to about 5 mole percent relative to said 2-alkenyl azlactone compound.

* * * * *

UNITED STATES PATENT AND TRADEMARK OFFICE
CERTIFICATE OF CORRECTION

PATENT NO. : 6,245,922 B1
DATED : June 12, 2001
INVENTOR(S) : Heilmann, Steven M.

It is certified that error appears in the above-identified patent and that said Letters Patent is hereby corrected as shown below:

Column 2,
Line 45, delete "ethylenically unsaturated monomers".

Column 20,
Line 37, "does" should read -- dose --.

Column 22,
Line 63, "does" should read -- dose --.

Signed and Sealed this

Tenth Day of June, 2003

JAMES E. ROGAN
*Director of the United States Patent and Trademark Office*